(12) United States Patent
Kim et al.

(10) Patent No.: US 7,205,911 B2
(45) Date of Patent: Apr. 17, 2007

(54) APPARATUS AND METHOD FOR 8B/10B CODE-GROUP VALIDITY CHECK

(75) Inventors: Junghak Kim, Jeonju (KR); Tae Whan Yoo, Daejeon (KR); Hyeong Ho Lee, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 714 days.

(21) Appl. No.: 10/718,759

(22) Filed: Nov. 21, 2003

(65) Prior Publication Data

US 2004/0103363 A1    May 27, 2004

(30) Foreign Application Priority Data

Nov. 23, 2002    (KR) ...................... 10-2002-0073312

(51) Int. Cl.
*H03M 7/00* (2006.01)
(52) U.S. Cl. ...................................................... 341/58
(58) Field of Classification Search ................. 341/55, 341/58, 95
See application file for complete search history.

(56) References Cited

U.S. PATENT DOCUMENTS

| | | | |
|---|---|---|---|
| 4,486,739 A | | 12/1984 | Franaszek et al. |
| 4,975,916 A | | 12/1990 | Miracle et al. |
| 5,229,769 A | | 7/1993 | Gleichert |
| 5,387,911 A | * | 2/1995 | Gleichert et al. ............. 341/95 |
| 6,295,010 B1 | * | 9/2001 | Thiesfeld ...................... 341/58 |
| 6,392,570 B1 | * | 5/2002 | Bucht ........................... 341/59 |

FOREIGN PATENT DOCUMENTS

KR    2001-0064238    7/2001

OTHER PUBLICATIONS

A.X. Widmer et al., "A DC-Balanced, Partitioned-Block, 8B/10B Transmission Code", IBM J.Res.Develop. vol. 27, No. 5, Sep. 1983.

* cited by examiner

*Primary Examiner*—Brian Young
(74) *Attorney, Agent, or Firm*—Blakely Sokoloff Taylor & Zafman

(57) ABSTRACT

An apparatus and method for checking validity of an 8B/10B code-group are provided. The apparatus for checking validity of an 8B/10B code-group includes a 6B/5B disparity classification unit, a 4B/3B disparity classification unit, an RD6 detection unit, an RD4 detection unit, an 8B/10B code-group rule violation detection unit, an RD error detection unit, and a unit for outputting 8B/10B code-group validity. The apparatus receives an 8B/10B code-group, divides into a least significant 6-bit nibble and a most significant 4-bit nibble, detects a running disparity, and by doing so, determines the validity of a code-group. The apparatus and method for checking validity of an 8B/10B code-group relatively shortens the critical path, which indicates the number of combinational logic circuits that should be operated in a unit time, and therefore the apparatus and method are appropriate to high-speed systems such as gigabit Ethernet systems.

12 Claims, 7 Drawing Sheets

FIG. 1

| Name | a b c d e i | A B C D E | K | D-1 | D0 |
|---|---|---|---|---|---|
| D.0 | 0 1 1 0 0 0 | 0 0 0 0 0 | 0 | + | − |
| D.0 | 1 0 0 1 1 1 | 0 0 0 0 0 | 0 | − | + |
| D.1 | 1 0 0 0 1 0 | 1 0 0 0 0 | 0 | + | − |
| D.1 | 0 1 1 1 0 1 | 1 0 0 0 0 | 0 | − | + |
| D.2 | 0 1 0 0 1 0 | 0 1 0 0 0 | 0 | + | − |
| D.2 | 1 0 1 1 0 1 | 0 1 0 0 0 | 0 | − | + |
| D.3 | 1 1 0 0 0 1 | 1 1 0 0 0 | 0 | x | 0 |
| D.4 | 0 0 1 0 1 0 | 0 0 1 0 0 | 0 | + | − |
| D.4 | 1 1 0 1 0 1 | 0 0 1 0 0 | 0 | − | + |
| D.5 | 1 0 1 0 0 1 | 1 0 1 0 0 | 0 | x | 0 |
| D.6 | 0 1 1 0 0 1 | 0 1 1 0 0 | 0 | x | 0 |
| D.7 | 1 1 1 0 0 0 | 1 1 1 0 0 | 0 | − | 0 |
| D.7 | 0 0 0 1 1 1 | 1 1 1 0 0 | 0 | + | 0 |
| D.8 | 0 0 0 1 1 0 | 0 0 0 1 0 | 0 | + | − |
| D.8 | 1 1 1 0 0 1 | 0 0 0 1 0 | 0 | − | + |
| D.9 | 1 0 0 1 0 1 | 1 0 0 1 0 | 0 | x | 0 |
| D.10 | 0 1 0 1 0 1 | 0 1 0 1 0 | 0 | x | 0 |
| D.11 | 1 1 0 1 0 0 | 1 1 0 1 0 | 0 | x | 0 |
| D.12 | 0 0 1 1 0 1 | 0 0 1 1 0 | 0 | x | 0 |
| D.13 | 1 0 1 1 0 0 | 1 0 1 1 0 | 0 | x | 0 |
| D.14 | 0 1 1 1 0 0 | 0 1 1 1 0 | 0 | x | 0 |
| D.15 | 1 0 1 0 0 0 | 1 1 1 1 0 | 0 | + | − |
| D.15 | 0 1 0 1 1 1 | 1 1 1 1 0 | 0 | − | + |
| D.16 | 0 1 1 0 1 1 | 0 0 0 0 1 | 0 | − | + |
| D.16 | 1 0 0 1 0 0 | 0 0 0 0 1 | 0 | + | − |
| D.17 | 1 0 0 0 1 1 | 1 0 0 0 1 | 0 | x | 0 |
| D.18 | 0 1 0 0 1 1 | 0 1 0 0 1 | 0 | x | 0 |
| D.19 | 1 1 0 0 1 0 | 1 1 0 0 1 | 0 | x | 0 |
| D.20 | 0 0 1 0 1 1 | 0 0 1 0 1 | 0 | x | 0 |
| D.21 | 1 0 1 0 1 0 | 1 0 1 0 1 | 0 | x | 0 |
| D.22 | 0 1 1 0 1 0 | 0 1 1 0 1 | 0 | x | 0 |
| D/K.23 | 1 1 1 0 1 0 | 1 1 1 0 1 | x | − | + |
| D/K.23 | 0 0 0 1 0 1 | 1 1 1 0 1 | x | + | − |
| D24 | 0 0 1 1 0 0 | 0 0 0 1 1 | 0 | + | − |
| D24 | 1 1 0 0 1 1 | 0 0 0 1 1 | 0 | − | + |
| D.25 | 1 0 0 1 1 0 | 1 0 0 1 1 | 0 | x | 0 |
| D.26 | 0 1 0 1 1 0 | 0 1 0 1 1 | 0 | x | 0 |
| D/K.27 | 1 1 0 1 1 0 | 1 1 0 1 1 | x | − | + |
| D/K.27 | 0 0 1 0 0 1 | 1 1 1 0 1 | x | + | − |
| D.28 | 0 0 1 1 1 0 | 0 0 1 1 1 | 0 | x | 0 |
| K.28 | 0 0 1 1 1 1 | 0 0 1 1 1 | 1 | − | + |
| K.28 | 1 1 0 0 0 0 | 0 0 1 1 1 | 1 | + | − |
| D/K.29 | 1 0 1 1 1 0 | 1 0 1 1 1 | x | − | + |
| D/K.29 | 0 1 0 0 0 1 | 1 0 1 1 1 | x | + | − |
| D/K.30 | 0 1 1 1 1 0 | 0 1 1 1 1 | x | − | + |
| D/K.30 | 1 0 0 0 0 1 | 0 1 1 1 1 | x | + | − |
| D.31 | 1 0 1 0 1 1 | 1 1 1 1 1 | 0 | − | + |
| D.31 | 0 1 0 1 0 0 | 1 1 1 1 1 | 0 | + | − |

FIG. 2

| Name | f g h j | F G H | K | D-1 | D0 |
|---|---|---|---|---|---|
| D/K.x.0 | 0 1 0 0 | 0 0 0 | x | + | − |
| D/K.x.0 | 1 0 1 1 | 0 0 0 | x | − | + |
| D/K.x.1 | 1 0 0 1 | 1 0 0 | x | x | 0 |
| K.28.1 | 0 1 1 0 | 1 0 0 | 1 |  | 0 |
| D/K.x.2 | 0 1 0 1 | 0 1 0 | x | x | 0 |
| K.28.2 | 1 0 1 0 | 0 1 0 | 1 |  | 0 |
| D/K.x.3 | 1 1 0 0 | 1 1 0 | x | − | 0 |
| D/K.x.3 | 0 0 1 1 | 1 1 0 | x | + | 0 |
| D/K.x.4 | 0 0 1 0 | 0 0 1 | x | + | − |
| D/K.x.4 | 1 1 0 1 | 0 0 1 | x | − | + |
| D/K.x.5 | 1 0 1 0 | 1 0 1 | x | x | 0 |
| K.28.5 | 0 1 0 1 | 1 0 1 | 1 |  | 0 |
| D/K.x.6 | 0 1 1 0 | 0 1 1 | x | x | 0 |
| K.28.6 | 1 0 0 1 | 0 1 1 | 1 |  | 0 |
| D.x.7 | 1 1 1 0 | 1 1 1 | 0 | − | + |
| D.x.7 | 0 0 0 1 | 1 1 1 | 0 | + | − |
| D/K.x.7 | 0 1 1 1 | 1 1 1 | x | − | + |
| D/K.x.7 | 1 0 0 0 | 1 1 1 | x | + | − |

FIG. 4

| Name | Disparity Class |
|---|---|
| P2ND6 | (P22*(e')*(i')) OR (P13*(e')) OR (P13(i')) |
| N2PD6 | (P22*e*i) OR (P31*e) OR (P31*i) |
| P2LD6 | P13*d*e*i |
| N2LD6 | P31*(d')*(e')*(i') |

Note.
1. * : Logical AND
2. ' : Logical NOT
3. ^ : Logical Exclusive-OR
4. P22 = ((a*b)*((c')*(d'))) OR ((c*d)*((a')*(b'))) OR ((a^b)*(c^d))
5. P13 = ((a^b)*((c')*(d'))) OR ((c^d)*((a')*(b')))
6. P31 = ((a^b)*c*d) OR ((c^d)*a*b)

FIG. 5

| Name | Disparity Class |
|---|---|
| P2ND4 | (((f')*(h')*(j')) OR ((f')*(g')*(j')) OR ((f')*(g')*(h')) OR ((g')*(h')*(j'))) |
| N2PD4 | (f*h*j) OR (f*g*j) OR (f*g*h) OR (g*h*j) |
| P2LD4 | (f')*(g')*h*j |
| N2LD4 | f*g*(h')*(j') |

Note.
1. * : Logical AND
2. ' : Logical NOT

FIG. 7

| Name | Running Disparity violation class |
|---|---|
| RDV1 | P2ND6B*(RDP') |
| RDV2 | N2PD6B*RDP |
| RDV3 | P2LD6B*(RDP') |
| RDV4 | N2LD6B*RDP |
| RDV5 | P2ND4B*(RD6') |
| RDV6 | N2PD4B*RD6 |
| RDV7 | P2LD4B*(RD6') |
| RDV8 | N2LD4B*RD6 |

Note. 1. * : Logical AND
2. ' : Logical NOT

FIG. 8

| Name | 8B/10B Line-Coding Rule violation class |
|---|---|
| CRV1 | a = b = c = d |
| CRV2 | P13*(e')*(i') |
| CRV3 | P31*e*i |
| CRV4 | f = g = h = j |
| CRV5 | e = i = f = g = h |
| CRV6 | i^(e = g = h = j) |
| CRV7 | ((e = i)^(g = h = j))*((c = d = e)') |
| CRV8 | (P31')*e*(i')*(g')*(h')*(j') |
| CRV9 | (P13')*(e')*i*g*h*j |

Note. 1. * : Logical AND
2. ' : Logical NOT
3. ^ : Logical Exclusive-OR
4. P22 = ((a*b)*((c')*(d'))) OR ((c*d)*((a')*(b'))) OR ((a^b)*(c^d))
5. P13 = ((a^b)*((c')*(d'))) OR ((c^d)*((a')*(b')))
6. P31 = ((a^b)*c*d) OR ((c^d)*a*b)

APPARATUS AND METHOD FOR 8B/10B CODE-GROUP VALIDITY CHECK

This application claims the priority of Korean Patent Application No. 2002-73312, filed Nov. 23, 2002, the disclosure of which is incorporated herein by reference in their entirety.

BACKGROUND OF THE INVENTION

1. Field of the Invention

The present invention relates to data transmission technologies, and more particularly, to an apparatus and method for checking validity of an 8B/10B code-group.

2. Description of the Related Art

Many of recent high-speed telecommunications systems in addition to the gigabit Ethernet, have employed DC-Balanced 8B/10B line code technologies standardized as a binary line coding method in ANSI X3.230-1994(FC-PN). The reason why the DC-Balanced 8B/10B line code technologies are used is because design of a transmitter and receiver for that is not complicated and immunity of the system against noise on lines can be improved without spending much cost.

In a data transmission method using the 8B/10B line code, the transmission side converts an 8-bit data into a 10-bit data according to a predetermined rule and transmits the data serially over transmission lines, and the reception side aligns the serially received data in a 10-bit data and again converts into an 8-bit data according to a predetermined rule. In the telecommunications technology field such as gigabit Ethernet, a 10-bit data generated by a predetermined rule is referred to as a code-group. Hereinafter, a code group in the present invention is referred to as an 8B/10B code-group.

In the prior art running disparity detection methods, there is a method using a nibble clock and a bit clock. This method needs double jobs, in which the boundary of an 8B/10B code-group is found and serial-to-parallel converted data are again converted into serial data, and also needs an additional apparatus for generating nibble clocks.

In another prior art running disparity detection method, the number of ones in the 10-bit data of a previously received 8B/10B code-group is obtained based on a currently received 8B/10B code-group, and the number of ones in the most significant 4-bit nibble is obtained again, and by using these two numbers, the previous running disparity is obtained. Then, the number of ones in the least significant 6-bit nibble of the currently received 8B/10B code-group and the number of ones in the most significant 4-bit nibble of the currently received 8B/10B code-group is obtained, respectively. Then, by using these three values, the previous running disparity, the disparities of the least significant 6-bit nibble and the most significant 4-bit nibble in the currently received 8B/10B code-group, the current running disparity is obtained.

Compared to the first prior art, the second prior art is not simpler in implementation and the execution time is not shortened.

Thus, when the prior art 8B/10B code-group validity detection apparatus is employed in a high-speed system such as a gigabit system, a critical path, which indicates the number of combinational logic circuits that should be operated in a unit time, is relatively long such that violation of a processing time limit may occur.

SUMMARY OF THE INVENTION

The present invention provides a running disparity detection method and apparatus, which reduces complexity and computation time by using only a byte clock used in a serial-to-parallel conversion apparatus without using a nibble clock and a bit clock.

The present invention also provides an apparatus and method for checking 8B/10B code-group validity, which has a structure appropriate for a high-speed system such as a gigabit Ethernet system, by reducing the critical path of the prior art apparatus for checking 8B/10B code-group validity.

According to an aspect of the present invention, there is provided an apparatus for checking validity of a code-group comprising a 6B/5B disparity classification unit which receives an 8B/10B code-group, classifies the least significant 6-bit nibble of the received 8B/10B code-group, and outputs the characteristic information of the disparity; a 4B/3B disparity classification unit which classifies the most significant 4-bit nibble of the received 8B/10B code-group and outputs the characteristic information of the disparity; an RD6 detection unit which receives the running disparity of a previously received 8B/10B code-group and the disparity classification characteristic information of the least significant 6-bit nibble, and generates the running disparity of the least significant 6-bit nibble of the 8B/10B code-group; an RD4 detection unit which receives the running disparity of the least significant 6-bit nibble output from the RD6 detection unit and the disparity classification characteristic information of the most significant 4-bit nibble, and generates the running disparity of the most significant 4-bit nibble of the 8B/10B code-group; an 8B/10B line code rule violation detection unit which detects whether or not the received 8B/10B code-group violates a predetermined line code rule; an RD error detection unit which receives the disparity classification characteristic information of the least significant 6-bit nibble, the disparity classification characteristic information of the most significant 4-bit nibble, the running disparity of the previously received 8B/10B code-group, and the running disparity of the least significant 6-bit nibble output from the RD6 detection unit, and detects a running disparity error of the least significant 6-bit nibble and an error of the most significant 4-bit nibble of the 8B/10B code-group; and a unit which receives and combines the output signal of the 8B/10B line code rule violation detection unit and the error signal of the RD error detection unit, and outputs whether or not the received 8B/10B code-group is valid.

According to another aspect of the present invention, there is provided a method for checking validity of a code-group comprising: (a) receiving an 8B/10B code-group, classifying the least significant 6-bit nibble of the received 8B/10B code-group, and outputting the characteristic information of the disparity; (b) classifying the most significant 4-bit nibble of the received 8B/10B code-group and outputting the characteristic information of the disparity; (c) receiving the running disparity of a previously received 8B/10B code-group and the disparity classification characteristic information of the least significant 6-bit nibble, and generating the running disparity of the least significant 6-bit nibble of the 8B/10B code-group; (d) receiving the running disparity of the least significant 6-bit nibble output in step (c) and the disparity classification characteristic information of the most significant 4-bit nibble, and generating the running disparity of the most significant 4-bit nibble of the 8B/10B code-group; (e) detecting whether or not the received 8B/10B code-group violates a predetermined line code rule; (f) receiving the disparity classification characteristic information of the least significant 6-bit nibble, the disparity classification characteristic information of the most significant 4-bit nibble, the running disparity of the previously received 8B/10B code-group, and the running disparity of the least significant 6-bit nibble output in step (c), and detecting a running disparity error of the least significant 6-bit nibble and an error of the most significant 4-bit nibble of the 8B/10B code-group; and (g) receiving and combining the output signal of step (e) and the error signal of step (f), and outputting whether or not the received 8B/10B code-group is valid.

BRIEF DESCRIPTION OF THE DRAWINGS

The above objects and advantages of the present invention will become more apparent by describing in detail exemplary embodiments thereof with reference to the attached drawings in which:

FIG. 1 is a 6B/5B decoding table of a received 8B/10B code-group, related to the prior art;

FIG. 2 is a 4B/3B decoding table of a received 8B/10B code-group, related to the prior art;

FIG. 4 is a table showing a 6B/5B disparity classification formula;

FIG. 5 is a table showing a 4B/3B disparity classification formula;

FIG. 7 is a table showing 8 types of running disparity errors;

FIG. 8 is a table showing 9 types of 8B/10B line code rule errors; and

DESCRIPTION OF THE PREFERRED EMBODIMENTS

Figure 3:
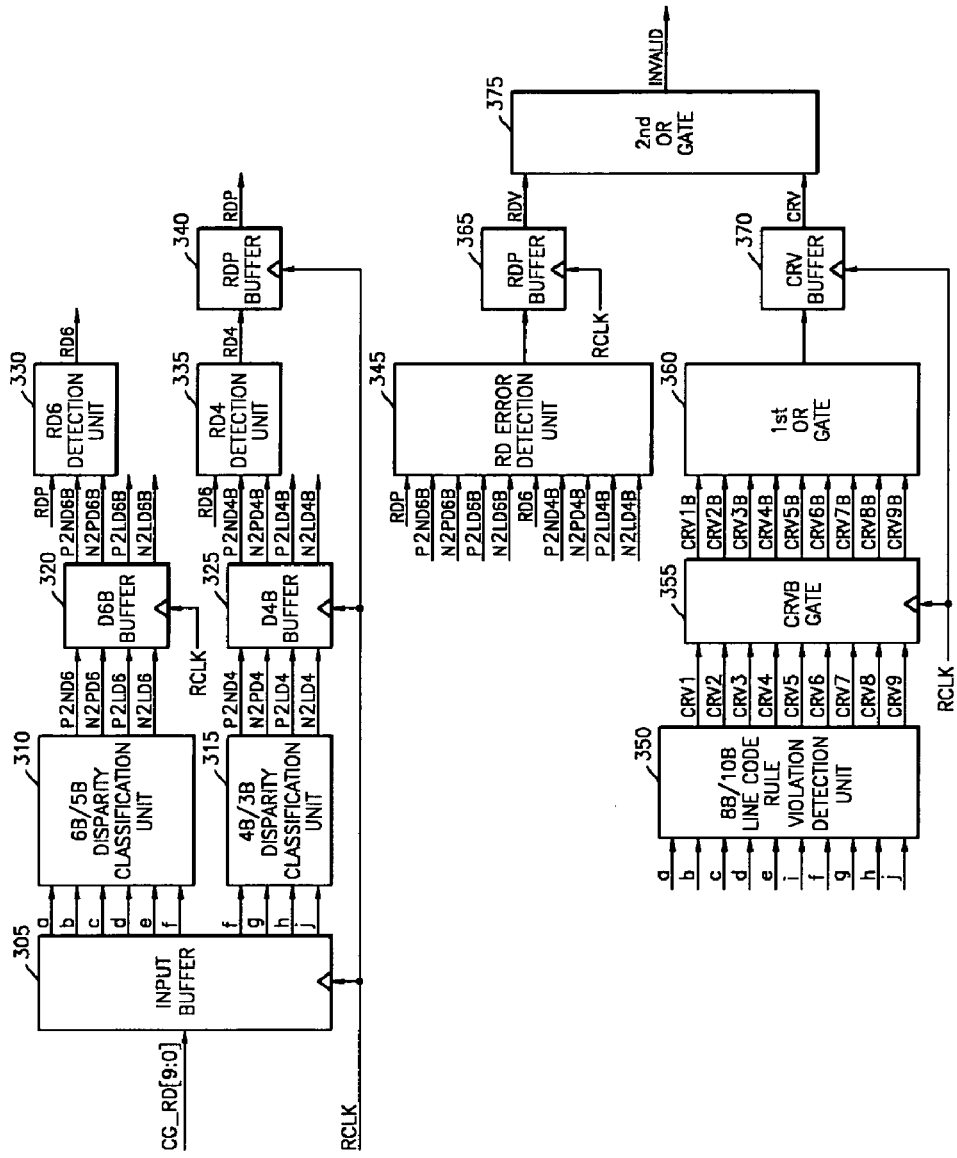
FIG. 3 is a block diagram of an apparatus for checking 8B/10B code-group validity of the present invention.

In a data transmission method using an 8B/10B line code technology, a disparity is the difference between the number of zeros and ones in an 8B/10B code-group, and a running disparity is the sum of disparities in continuous 8B/10B code-groups. Also, a run length is the number of continuous zeros or ones in serial data over a line or in an 8B/10B code-group.

When 8-bit data before conversion into an 8B/10B code-group are expressed from the least significant bit to the most significant bit as "ABCDEFGH", and bits of an 8B/10B code-group after conversion into 10 bits are expressed from the least significant bit as "abcdeifghj", the run length of "abcdei" is limited to 4 or less and that of "fghj" is limited to 3 or less, in the data transmission method using an 8B/10B line code, and therefore the disparity of each nibble becomes either +2, −2 or 0.

More specifically, in the case of "abcdei", since a maximum of 4 bits can be zeros or ones and possible pairs of (the number of zeros, the number of ones) include only (2, 4), (3, 3), and (4, 2), the disparity becomes either +2, −2 or 0. In the case of "fghj", since a maximum of 3 bits can be zeros or ones and possible pairs of (the number of zeros, the number of ones) include only (1, 3), (2, 2), and (3, 1), the disparity becomes either +2, −2 or 0.

In the data transmission method using the 8B/10B line code technology, when the transmission side converts an 8-bit data into an 8B/10B code-group, a predetermined rule for preventing 8B/10B code-groups having an identical disparity of +2 or −2 from being continuous is applied. Accordingly, the reception side should determine and indicate whether or not a received 8B/10B code-group violates the predetermined rule.

Generally in the data transmission method using the 8B/10B line code technology, the reception side converts a received 8B/10B code-group into an 8-bit data according to a rule based on tables of FIGS. 1 and 2.

FIG. 1 is a 6B/5B decoding table of a received 8B/10B code-group. That is, when bits of a received 8B/10B code-group are expressed from the least significant bit to the most significant bit as "abcdeifghj", and bits of converted 8-bit data are expressed from the least significant bit as "ABCDEFGH", FIG. 1 shows a 6B/5B decoding rule for converting "abcdei", which is the least significant 6-bit nibble of the received 8B/10B code-group, into "ABCDE".

FIG. 2 is a 4B/3B decoding table of a received 8B/10B code-group. That is, it shows a 4B/3B decoding rule for converting "fghj", which is the most significant 4-bit nibble of the received 8B/10B code-group, into "FGH". In FIGS. 1 and 2, D0 denotes a disparity of each nibble in an 8B/10B code-group, and D-1 denotes a disparity that a previously received nibble should have based on the currently received nibble according to a predetermined running disparity rule.

In FIGS. 1 and 2, if the disparity that each nibble has is +2, it is expressed as "+", if the disparity is −2, it is expressed as "−", and if the disparity is 0, it is expressed as 0. When x indicates a disparity, it indicates that D-1 is "−" or "+", and when x indicates an arbitrary bit value, it indicates 1 or 0.

In FIG. 1, since the value of "abcde" of D.0 that is a first received 8B/10B code-group is "011000", the number of zeros is 4 and the number of ones is 2. Accordingly, disparity D0 is −2 and is expressed as "−". Since the value of "abcdei" of the next received D.0 is "100111", the number of zeros is 2 and the number of ones is 4. Accordingly, disparity D0 is +2 and is expressed as "+".

D-1 will now be explained in detail. When an 8B/10B encoder converts 8-bit data into a 10-bit code-group, the running disparity of the previously transmitted code-group is considered. That is, if the previous running disparity is "+ (positive)", the code-group to be currently transmitted has a "−" disparity (negative disparity) or a neutral disparity, and if the previous running disparity is "− (negative)", the code-group to be currently transmitted has a "+" disparity (positive disparity) or a neutral disparity.

Also, a code-group comprises a 6-bit nibble and a 4-bit nibble, and to each nibble, the identical rule is applied. When a current time point is used as a criterion, D0 is the disparity value of the currently received nibble and D-1 is the running disparity to the previously received nibble. Accordingly, if D0 is "+", D-1 should be "−" and if D0 is "−", D-1 should be "+" and if D0 is 0 (neutral), D-1 will be "don't care". However, as exceptions, in D.7 and D/K.x.3 there are cases where even when D0 is 0, D-1 is "+" or "−". In these cases, D0 nibbles are coded in ways different from the predetermined rule, as shown in FIGS. 1 and 2.

K indicates that a special code group is used. The special code group is to indicate the boundary (start and end) of a transmission frame and to synchronize a code-group, and is explained in detail in the gigabit Ethernet standards.

FIG. 3 is a block diagram of an apparatus for checking 8B/10B code-group validity of the present invention.

The apparatus for checking 8B/10B code-group validity of the present invention comprises an input buffer 305, a 6B/5B disparity classification unit 310, a 4B/3B disparity classification unit 315, a D6B buffer 320, a D4B buffer 325, an RD6 detection unit 330, an RD4 detection unit 335, an RDP buffer 340, an RD error detection unit 345, an 8B/10B line code rule violation detection unit 350, a CRVB buffer 355, a first OR gate 360, an RDV buffer 365, a CRV buffer 370, and a second OR gate 375.

The input buffer 305 receives an 8B/10B code-group (CG_RD[9:0]) at a rising or falling edge of a byte clock (RCLK), which is used to convert received serial data into 10-bit parallel data, buffers and outputs the code-group of 10-bit parallel data.

The byte clock (RCLK) is a clock obtained by frequency-dividing a bit clock by 10, the bit clock which is restored from a data string serially received by the reception side through transmission lines. The byte clock (RCLK) is used to align 10-bit parallel data in the form of an 8B/10B code group, and thereafter is used by all function units processing the 8B/10B code-group.

The 6B/5B disparity classification unit 310 classifies the disparity characteristics of "abcdei", which is the least significant 6-bit nibble of the 8B/10B code-group, into four types (P2ND6, N2PD6, P2LD6, N2LD6), by referring to FIG. 1, and outputs the result. More specifically, referring to FIG. 1, the disparity characteristics are divided into all four cases, including when D-1 is "+" and D0 is "−", when D-1 is "−" and D0 is "+", when D-1 is "+" an and when D-1 is "−" and D0 is "0".

When bits of the least significant 6-bit nibble of the 8B/10B code-group having the same value as CG_RD[9:0] output from the input buffer 305 are expressed from the least significant bit as a, b, c, d, e, i, and referring to FIGS. 1 and 3, the four types are expressed as P2ND6, N2PD6, P2LD6, and N2LD6, respectively, the four types expressed by combinational logic expressions are shown in FIG. 4.

FIG. 4 is a table showing a 6B/5B disparity classification formula.

Referring to FIG. 4, P2ND6 indicates that the disparity of the least significant 6-bit nibble is "−", N2PD6 indicates that the disparity of the least significant 6-bit nibble is "+", P2LD6 indicates that abcdei of the least significant 6-bit nibble is "000111" and N2LD6 indicates that abcdei of the least significant 6-bit nibble is "111000".

The 4B/3B disparity classification unit 315 classifies the disparity characteristics of "fghj", which is the most significant 4-bit nibble of the 8B/10B code-group, into four types (P2ND4, N2PD4, P2LD4, N2LD4), by referring to FIG. 2, and outputs the result. More specifically, referring to FIG. 2, the disparity characteristics are divided into all four cases, including when D-1 is "+" and D0 is "−", when D-1 is "−" and D0 is "+", when D-1 is "+" and D0 is "0", and when D-1 is "−" and D0 is "0".

When bits of the most significant 4-bit nibble of the 8B/10B code-group having the same value as CG_RD[9:0] output from the input buffer 305 are expressed from the least significant bit as f, g, h, j, and referring to FIGS. 2 and 3, the four types are expressed as P2ND4, N2PD4, P2LD4, and N2LD4, respectively, the four types expressed by combinational logic expressions are shown in FIG. 5.

FIG. 5 is a table showing a 4B/3B disparity classification formula.

Referring to FIG. 5, P2ND4 indicates that the disparity of the most significant 4-bit nibble is "−", N2PD4 indicates that the disparity of the most significant 4-bit nibble is "+", P2LD4 indicates that fghj of the most significant 4-bit nibble is "0011" and N2LD4 indicates that fghj of the most significant 4-bit nibble is "1100".

The D6B buffer 320 receives P2ND6, N2PD6, P2LD6, and N2LD6 with being synchronized at the rising or falling edge of the byte clock (RCLK), and buffers and outputs P2ND6B, N2PD6B, P2LD6B, and N2LD6B.

The D4B buffer 325 receives P2ND4, N2PD4, P2LD4, and N3LD4 with being synchronized at the rising or falling edge of the byte clock (RCLK), and buffers and outputs P2ND4B, N2PD4B, P2LD4B, and N3LD4B.

For the 8B/10B code-group which is currently in the process for detecting a running disparity, the RD6 detection unit 330 receives RDP that is the running disparity of the previously received 8B/10B code-group and receives p2ND6B and N2PD6B that are signals buffered and output from the D6B buffer 320, and then outputs the running disparity of the least significant 6-bit nibble of the 8B/10B code-group.

Figure 6A:
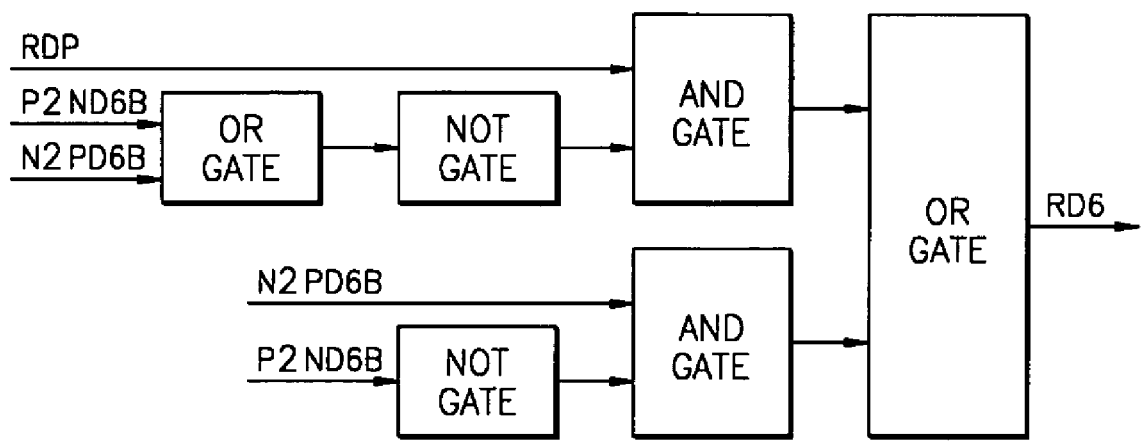
FIG. 6a is a detailed block diagram of an RD6 detection unit of the present invention.

FIG. 6A is a detailed block diagram of the RD6 detection unit 330 of the present invention.

Referring to FIG. 6A, output value RD6 will now be explained in detail. If p2ND6B is 1, RD6 is 0 irrespective of other input values, and if N2PD6B is 1, RD6 is 1. If P2ND6B is 0 and N2PD6B is 0, the RDP value as is output as RD6. Since P2ND6, N2PD6, P2LD6, and N2LD6 are mutually exclusive, if one of them is 1, the values of the remaining three become all zeros. Accordingly, the result as described above is obtained.

The RD4 detection unit 335 receives RD6 output from the RD6 detection unit 330 and receives P2ND4B and N2PD4B that are signals buffered and output from the D4B buffer 325, and then outputs the running disparity of the most significant 4-bit nibble of the 8B/10B code-group.

Figure 6B:
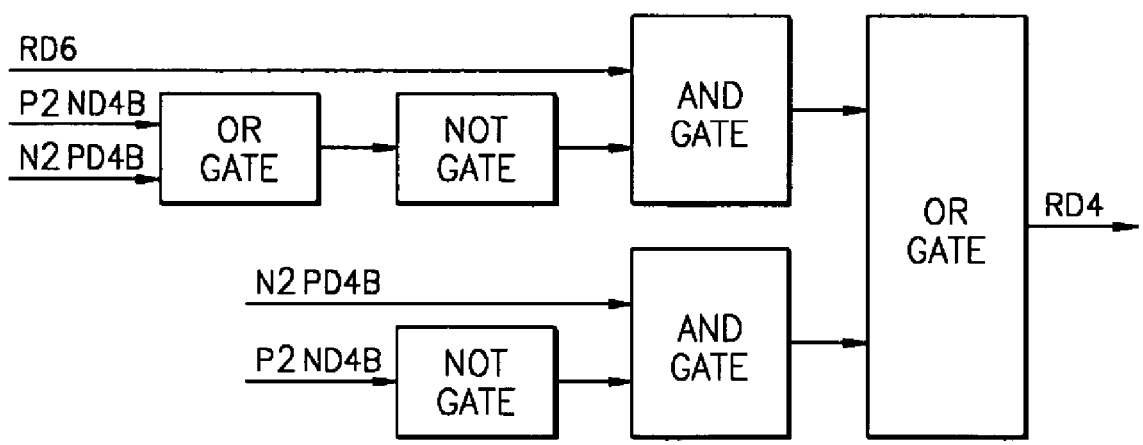
FIG. 6b is a detailed block diagram of an RD4 detection unit of the present invention.

FIG. 6B is a detailed block diagram of the RD4 detection unit 335 of the present invention.

Referring to FIG. 6B, output value RD4 will now be explained in detail. If P2ND4B is 1, RD4 is 0, and if N2PD4B is 1, RD4 is 1. If P2ND4B is 0 and N2PD4B is 0, the RD6 value as is output as RD4. Since P2ND4, N2PD4, P2LD4, and N2LD4 are mutually exclusive as P2ND6, N2PD6, P2LD6, and N2LD6, if one of them is 1, the values of the remaining three become all zeros. Accordingly, the result as described above is obtained.

In order to detect the running disparity of the next 8B/10B code-group, the RDP buffer 340 receives RD4 output from the RD4 detection unit 335 at the rising or falling edge of RCLK, and outputs RDP having the same value as RD4. Accordingly, the running disparity RDP output form the RDP buffer 340 is the previous running disparity when the current time point is taken as a criterion.

The RD error detection unit 345 receives RDP, P2ND6B, N2PD6B, P2LD6B, and N2LD6B, and detects a running disparity error on the least significant 6-bit nibble of the 8B/10B code-group. Also, the RD error detection unit 345 receives RD6, P2ND4B, N2PD4B, P2LD4B, and N3LD4B, and detects a running disparity error on the most significant 4-bit nibble of the 8B/10B code-group.

The running disparity errors are classified into all 8 types (RDV1, RDV2, RDV3, RDV4, RDV5, RDV6, RDV7, and RDV8). Those can be expressed, using combinational logic expression, as shown in FIG. 7.

FIG. 7 is a table showing 8 types of running disparity errors.

Referring to FIG. 7, if any one of the 8 types of running disparity errors occurs in an input signal, the RD error detection unit 345 generates and outputs a signal indicating a running disparity error.

The 8B/10B line code rule violation detection unit 350 classifies violations by an 8B/10B code-group of a predetermined 8B/10B line code rule into 9 types (CRV1, CRV2, CRV3, CRV4, CRV5, CRV6, CRV7, CRV8, and CRV9) and determines whether or not the 8B/10B code-group output from the input buffer 305 violates each of the 9 types.

The violation of the predetermined 8B/10B line code rule will now be explained in detail. Since the 8B/10B encoder performs 1:1 mapping of 8-bit data into a 10-bit code-group, 10-bit code-groups that can be generated can be just a small part of what can be generated by using 10 bits.

That is, 10-bit code-groups that can be generated by the 8B/10B encoder are already determined according to 8-bit input data of the encoder. Of course, depending on whether the previous running disparity is "+" or "−", two results may come, but this is also predetermined. Referring to the 6B/5B decoding table of FIG. 1 and the 4B/3B decoding table of FIG. 2, it can be shown that depending on each of the 6-bit nibble and 4-bit nibble, the output of the decoder are 1:1 mapped.

Accordingly, the case when the predetermined 8B/10B line code rule is violated indicates a code-group that is not in this conversion rule table. In other words, if a code-group that is not in the mapping table is received, it is a case when the line code rule is violated. For example, the case when a=b=c=d (that is, a, b, c, and d have an identical value) cannot be found in the 6B/5B decoding table of FIG. 1.

FIG. 8 is a table showing 9 types of 8B/10B line code rule errors.

That is, assuming that 9 error types are CRV1, CRV2, CRV3, CRV4, CRV5, CRV6, CRV7, CRV8, and CRV9, each of the output values can be expressed using combinational logic expression. In other words, as described above, the combinations of 10-bit code-groups that cannot, and should not be generated by the 8B/10B encoder are expressed as logic expressions.

The CRVB buffer 355 receives CRV1, CRV2, CRV3, CRV4, CRV5, CRV6, CRV7, CRV8, and CRV9 at the rising or falling edge of RCLK and buffers and outputs CRV1B, CRV2B, CRV3B, CRV4B, CRV5B, CRV6B, CRV7B, CRV8B, and CRV9B.

The first OR gate 360 is a combinational logic circuit which outputs 1 if any one of CRV1B, CRV2B, CRV3B, CRV4B, CRV5B, CRV6B, CRV7B, CRV8B, and CRV9B that are output from the CRVB buffer 355 is 1, and otherwise outputs 0.

The RDV buffer 365 buffers and outputs a signal, which is output from the RD error detection unit 345 at the rising or falling edge of RCLK. The CRV buffer 370 receives a signal, which is output from the OR gate 360 at the rising or falling edge of RCLK, and buffers and outputs the signal.

The second OR gate 375 is a combinational logic circuit which outputs 1 if any one of outputs form the CRV buffer 370 and the RDV buffer 375 is 1, and otherwise outputs 0. Accordingly, if the output signal INVALID is 1, it indicates that the received code-group is invalid, that is, an error occurred during the reception, and if INVALID is 0, it indicates that the received code-group is valid, that is, no error occurred during the reception.

Figure 9:
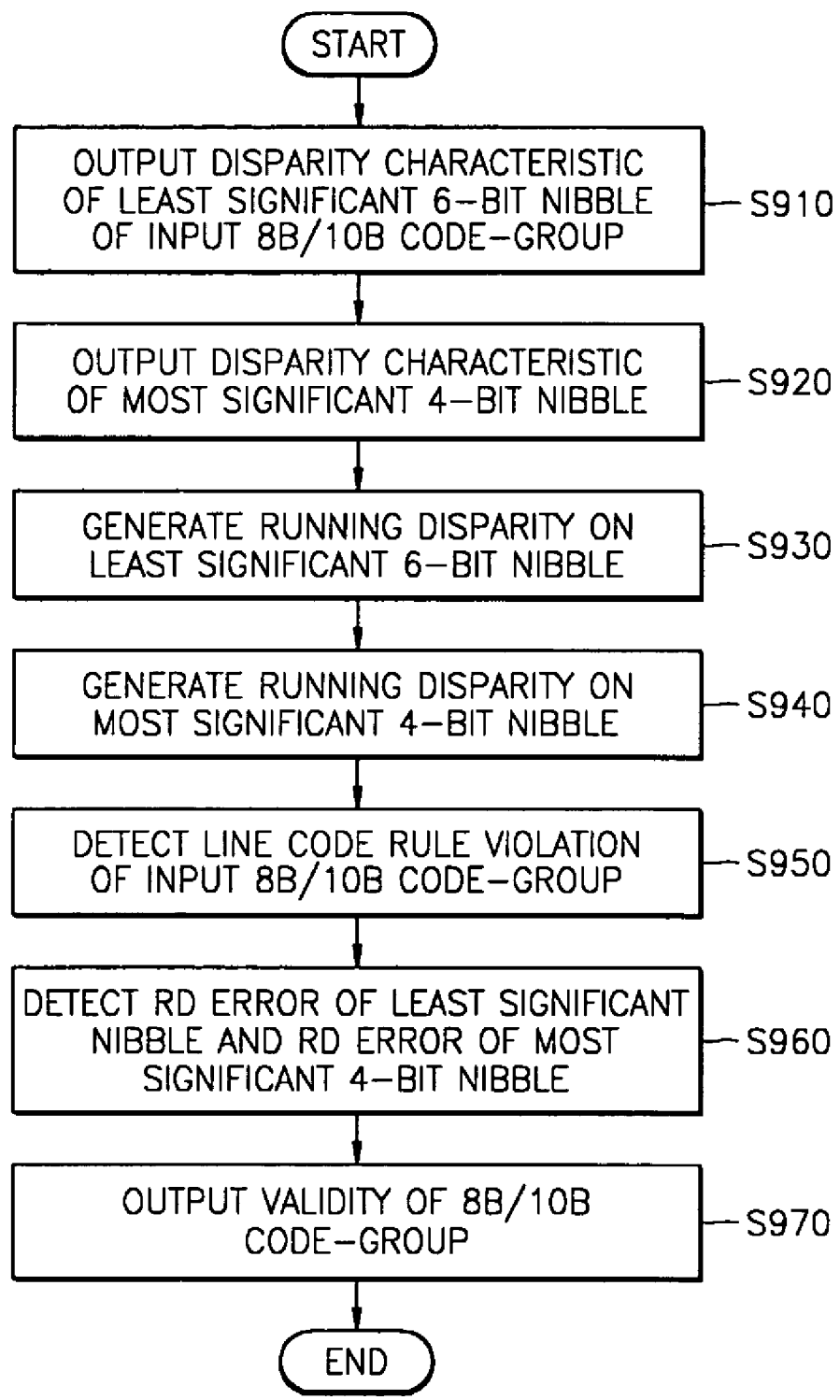
FIG. 9 is a flowchart of the steps performed by a method for checking 8B/10B code-group validity of the present invention.

FIG. 9 is a flowchart of the steps performed by a method for checking 8B/10B code-group validity of the present invention.

First, an 8B/10B code-group is received, the disparity of the least significant 6-bit nibble of the received 8B/10B code-group is classified and the characteristic information is output in step S910. Then, the most significant 4-bit nibble of the received 8B/10B code-group is classified and the characteristic information is output in step S920. Steps S910 and S920 can be performed at the same time.

Next, the running disparity of the previously received 8B/10B code-group and the disparity classification characteristic information of the least significant 6-bit nibble output in step S910 are received and the running disparity of the least significant 6-bit nibble of the 8B/10B code-group is generated in step S930. Then, the running disparity of the least significant 6-bit nibble output in step S930 and the disparity classification characteristic information of the most significant 4-bit nibble are received and the running disparity of the most significant 4-bit nibble of the 8B/10B code-group is generated in step S940. Steps S930 and S940 described above can also be performed at the same time.

Separately from steps S910 through S940 described above, it is checked whether or not the received 8B/10B code-group violates a predetermined line code rule in step S950. Then, the disparity classification characteristic information of the least significant 6-bit nibble, the disparity classification characteristic information of the most significant 4-bit nibble, the running disparity of the previously received 8B/10B code-group, and the running disparity of the least significant 6-bit nibble output in step S930 are received, and a running disparity error of the least significant 6-bit nibble and an error of the most significant 4-bit nibble of the 8B/10B code-group are detected in step s960. Finally, the output signal of step S950 and the error signal of step S960 are received and combined, and the validity of the input 8B/10B code-group is output in step S970.

Optimum embodiments have been explained above and are shown. However, the present invention is not limited to the preferred embodiment described above, and it is apparent that variations and modifications by those skilled in the art can be effected within the spirit and scope of the present invention. Therefore, the embodiments should be understood not as limitations but as explanations. The scope of the present invention is not determined by the above description but by the accompanying claims and variations and modifications may be made to the embodiments of the invention without departing from the scope of the invention as defined by the appended claims and legal equivalents.

As described above, the apparatus for checking validity of a code-group according to the present invention uses only RCLK, a byte clock, such that it removes double jobs of the prior art running disparity detection method using a nibble clock and a bit clock, in which the boundary of an 8B/10B code-group is found and serial-to-parallel converted data are converted into serial data again, and does not need an additional apparatus for generating nibble clocks.

In addition, by using the D6B buffer, the D4B buffer, the CRVB buffer, the RDV buffer, and the CRV buffer, the apparatus and method for checking validity of an 8B/10B code-group relatively shortens the critical path, which indicates the number of combinational logic circuits that should be operated in a unit time, and therefore the apparatus and method are appropriate to high-speed systems such as gigabit Ethernet systems. Also, by using a D6B buffer, the D4B buffer, the CRVB buffer, the RDV buffer, the CRV buffer, the 6B/5B disparity classification unit, the 4B/3B disparity classification unit, the RD6 detection unit, the RD4 detection unit, and the RD error detection unit, the method can be implemented more easily than the prior art running disparity error detection method and the computation time can be shortened.

What is claimed is:

1. An apparatus for checking validity of a code-group comprising:
a 6B/5B disparity classification unit which receives an 8B/10B code-group, classifies the least significant 6-bit nibble of the received 8B/10B code-group, and outputs the characteristic information of the disparity;
a 4B/3B disparity classification unit which classifies the most significant 4-bit nibble of the received 8B/10B code-group and outputs the characteristic information of the disparity;
an RD6 detection unit which receives the running disparity of a previously received 8B/10B code-group and the disparity classification characteristic information of the least significant 6-bit nibble, and generates the running disparity of the least significant 6-bit nibble of the 8B/10B code-group;
an RD4 detection unit which receives the running disparity of the least significant 6-bit nibble output from the RD6 detection unit and the disparity classification characteristic information of the most significant 4-bit nibble, and generates the running disparity of the most significant 4-bit nibble of the 8B/10B code-group;
an 8B/10B line code rule violation detection unit which detects whether or not the received 8B/10B code-group violates a predetermined line code rule;
an RD error detection unit which receives the disparity classification characteristic information of the least significant 6-bit nibble, the disparity classification characteristic information of the most significant 4-bit nibble, the running disparity of the previously received 8B/10B code-group, and the running disparity of the least significant 6-bit nibble output from the RD6 detection unit, and detects a running disparity error of the least significant 6-bit nibble and an error of the most significant 4-bit nibble of the 8B/10B code-group; and
a unit which receives and combines the output signal of the 8B/10B line code rule violation detection unit and the error signal of the RD error detection unit, and outputs whether or not the received 8B/10B code-group is valid.

2. The apparatus of claim 1, wherein the 6B/5B disparity classification unit receives the 8B/10B code-group, and outputs signal P2ND6 indicating that the disparity of the least significant 6-bit nibble is a negative value, signal N2PD6 indicating that the disparity of the least significant 6-bit nibble is a positive value, signal P2LD6 indicating that data of the least significant 6-bit nibble is "000111" and signal N2LD6 indicating that data of the least significant 6-bit nibble is "111000".

3. The apparatus of claim 2, wherein if the signal P2ND6 is 1, the RD6 detection unit outputs 0 irrespective of other input values, if the signal N2PD6 is 1, outputs 1, and if the signal P2ND6 is 0 and the signal N2PD6 is 0, receives the running disparity of the previously received 8B/10B code-group and outputs the running disparity as is.

4. The apparatus of claim 1, wherein the 4B/3B disparity classification unit receives the 8B/10B code-group, and outputs signal P2ND4 indicating that the disparity of the most significant 4-bit nibble is a negative value, signal N2PD4 indicating that the disparity of the most significant 4-bit nibble is a positive value, signal P2LD4 indicating that data of the most significant 4-bit nibble is "0011" and signal N2LD4 indicating that data of the most significant 4-bit nibble is "1100".

5. The apparatus of claim 4, wherein if the signal P2ND4 is 1, the RD4 detection unit outputs 0 irrespective of other input values, if the signal N2PD4 is 1, outputs 1, and if the signal P2ND4 is 0 and the signal N2PD4 is 0, receives the running disparity output from the RD6 detection unit and outputs the running disparity as is.

6. The apparatus of claim 1, wherein the RD error detection unit detects a running disparity error of the least significant 6-bit nibble and a running disparity error of the most significant 4-bit nibble of the 8B/10B code-group, and if any one of the error types occurs, determines that there is an error and outputs an error signal.

7. The apparatus of claim 1, wherein the unit for outputting whether or not the received 8B/10B code-group is valid performs OR operation of the error signal of the RD error detection unit and the output signal of the 8B/10B line code rule violation detection unit and outputs the result.

8. A method for checking validity of a code-group comprising:
(a) receiving an 8B/10B code-group, classifying the least significant 6-bit nibble of the received 8B/10B code-group, and outputting the characteristic information of the disparity;
(b) classifying the most significant 4-bit nibble of the received 8B/10B code-group and outputting the characteristic information of the disparity;
(c) receiving the running disparity of a previously received 8B/10B code-group and the disparity classification characteristic information of the least significant 6-bit nibble, and generating the running disparity of the least significant 6-bit nibble of the 8B/10B code-group;
(d) receiving the running disparity of the least significant 6-bit nibble output in step (c) and the disparity classification characteristic information of the most significant 4-bit nibble, and generating the running disparity of the most significant 4-bit nibble of the 8B/10B code-group;
(e) detecting whether or not the received 8B/10B code-group violates a predetermined line code rule;
(f) receiving the disparity classification characteristic information of the least significant 6-bit nibble, the disparity classification characteristic information of the most significant 4-bit nibble, the running disparity of the previously received 8B/10B code-group, and the running disparity of the least significant 6-bit nibble output in step (c), and detecting a running disparity error of the least significant 6-bit nibble and an error of the most significant 4-bit nibble of the 8B/10B code-group; and
(g) receiving and combining the output signal of step (e) and the error signal of step (f), and outputting whether or not the received 8B/10B code-group is valid.

9. The method of claim 8, wherein in step (a), the 8B/10B code-group is received and signal P2ND6 indicating that the disparity of the least significant 6-bit nibble is a negative value, signal N2PD6 indicating that the disparity of the least significant 6-bit nibble is a positive value, signal P2LD6 indicating that data of the least significant 6-bit nibble is "000111" and signal N2LD6 indicating that data of the least significant 6-bit nibble is "111000" are output.

10. The method of claim 8, wherein in step (c) if the signal P2ND6 is 1, 0 is output irrespective of other input values, if the signal N2PD6 is 1, 1 is output, and if the signal P2ND6 is 0 and the signal N2PD6 is 0, the running disparity of the previously received 8B/10B code-group is received and output as is.

11. The method of claim 8, wherein in step (b), the 8B/10B code-group is received, and signal P2ND4 indicating that the disparity of the most significant 4-bit nibble is a negative value, signal N2PD4 indicating that the disparity of the most significant 4-bit nibble is a positive value, signal P2LD4.

12. The method of claim 11, wherein in step (d) if the signal P2ND4 is 1, 0 is output irrespective of other input values, if the signal N2PD4 is 1, outputs 1, and if the signal P2ND4 is 0 and the signal N2PD4 is 0, the running disparity output in step (c) is received and output as is.

* * * * *